United States Patent [19]

Tsurushima

[11] 3,992,677
[45] Nov. 16, 1976

[54] MUTING CIRCUIT

[75] Inventor: Katsuaki Tsurushima, Kawasaki, Japan

[73] Assignee: Sony Corporation, Tokyo, Japan

[22] Filed: Apr. 23, 1975

[21] Appl. No.: 570,635

[30] Foreign Application Priority Data
Apr. 30, 1974 Japan.............................. 49-49190

[52] U.S. Cl.................................. 330/29; 330/51; 330/149
[51] Int. Cl.² ........................................ H03F 1/26
[58] Field of Search............ 330/29, 51, 149, 207 P; 325/402, 403; 179/1 P

[56] References Cited
UNITED STATES PATENTS
3,544,720  12/1970  Corderman...................... 330/207 P
3,889,202  6/1975  Suzuki ............................. 330/29 X Primary Examiner—James B. Mullins
Attorney, Agent, or Firm—Hill, Gross, Simpson, Van Santen, Steadman, Chiara & Simpson

[57] ABSTRACT

A muting circuit which includes an amplifier having input and output terminals and a bi-directional transistor connectd between the output terminal and a circuit point of low reference potential. The transistor has emitter base and collector regions, the emitter region having a low impurity concentration substantially the same as that of the collector region and a potential barrier being provided opposite to the junction of the emitter and base regions at a distance which is smaller than the diffusion length of minority carriers of the base region. A control signal generating means including time constant means for turning on the bi-directional transistor is provided. The time constant means assures that the bi-directional transistor will be on for only a brief interval of time to bypass the output signal of the amplifier to the low reference potential circuit point and thereby avoid the presence of a pop noise at the speaker.

7 Claims, 3 Drawing Figures

MUTING CIRCUIT

BACKGROUND OF THE INVENTION

1. Field of the Invention

This invention relates to a muting circuit, and more particularly to a muting circuit effective to use for an amplifier.

2. Description of the Prior Art

In the prior art, it has been known that pop noise is generated at the output terminal of an amplifier in response to the rising-up and falling-down transition characteristics of a voltage supplied from a voltage source to the amplifier, and the pop noise is reproduced from a speaker to give unpleasant feeling to a listener with the result that the speaker may be damaged. For this reason, the output signal of the amplifier is usually muted for a predetermined time after the ON-OFF manipulation of a voltage source. A muting circuit of this kind is disclosed in U.S. Pat. No. 3,828,267 patented on Aug. 6, 1974 which has the same inventor and assignee as the present application. In the muting circuit disclosed in this patent, a switching transistor is provided between the output terminal of the amplifier and a reference point, and the transistor is turned on for a predetermined time after the ON-OFF manipulation of the voltage source so that a signal at the output terminal is not supplied to the speaker for a predetermined time. In this case, one part of the output signal leaks through the base-collector junction of the transistor at its nonconductive time during negative half cycles of the output signal of the amplifier, so that the output signal could be distorted. For this reason, in the prior art, the base electrode of the transistor is applied with a cut-off bias voltage larger than the peak value during the negative cycle. However, when the aforesaid output amplifier is a large output amplifier, the peak value of the output signal becomes large thereby increasing the cut-off bias voltage supplied to the base electrode, so that the collector-opened base-emitter withstanding voltage $BV_{EBO}$ of the switching transistor is required to be larger than the value of $BV_{EBO}$ of the switching transistor cannot be derived from the amplifier and hence a switching transistor used in the muting circuit of a large output amplifier is desired to have a sufficiently large $BV_{EBO}$.

SUMMARY OF THE INVENTION

In accordance with this invention, a muting circuit is provided, which includes a signal transmitting path having input and output terminals, an impedance connected therebetween. A transistor is provided which has emitter, base and collector regions, the emitter region having a low impurity concentration substantially the same as that of the collector region, and a potential barrier being provided opposite to the junction of the emitter and base regions at a distance smaller than the diffusion length of minority carrier of the base region. The emitter, base and collector regions have emitter, base and collector electrodes, respectively. The collector and emitter electrodes are connected to the connection point between the impedance and the output terminal and to a reference point. A control signal generating circuit is provided for producing a control signal in response to the ON-OFF manipulation of a voltage source to supply an operating voltage to the amplifier, the control signal being supplied to the base electrode of the transistor, whereby an output signal produced at the output terminal of the signal transmitting path is controlled in response to the control signal.

Accordingly, it is a principal object of this invention to provide a muting circuit free from the disadvantages of the prior art.

It is another object of this invention to provide a muting circuit which does not produce distortion in the amplifier output signal.

It is a further object of this invention to provide a muting circuit suitable for use in an amplifier employing two voltage sources.

It is a still further object of this invention to provide a muting circuit using a transistor whose $BV_{EBO}$ is extremely large.

Other objects, features and advantages of this invention are apparent from the following description taken in conjunction with the drawings wherein reference numerals are used to describe a preferred embodiment.

BRIEF DESCRIPTION OF THE DRAWNGS

DESCRIPTION OF THE PREFERRED EMBODIMENT

A description will hereinafter be given on one embodiment of this invention with reference to the drawings.

Figure 1:
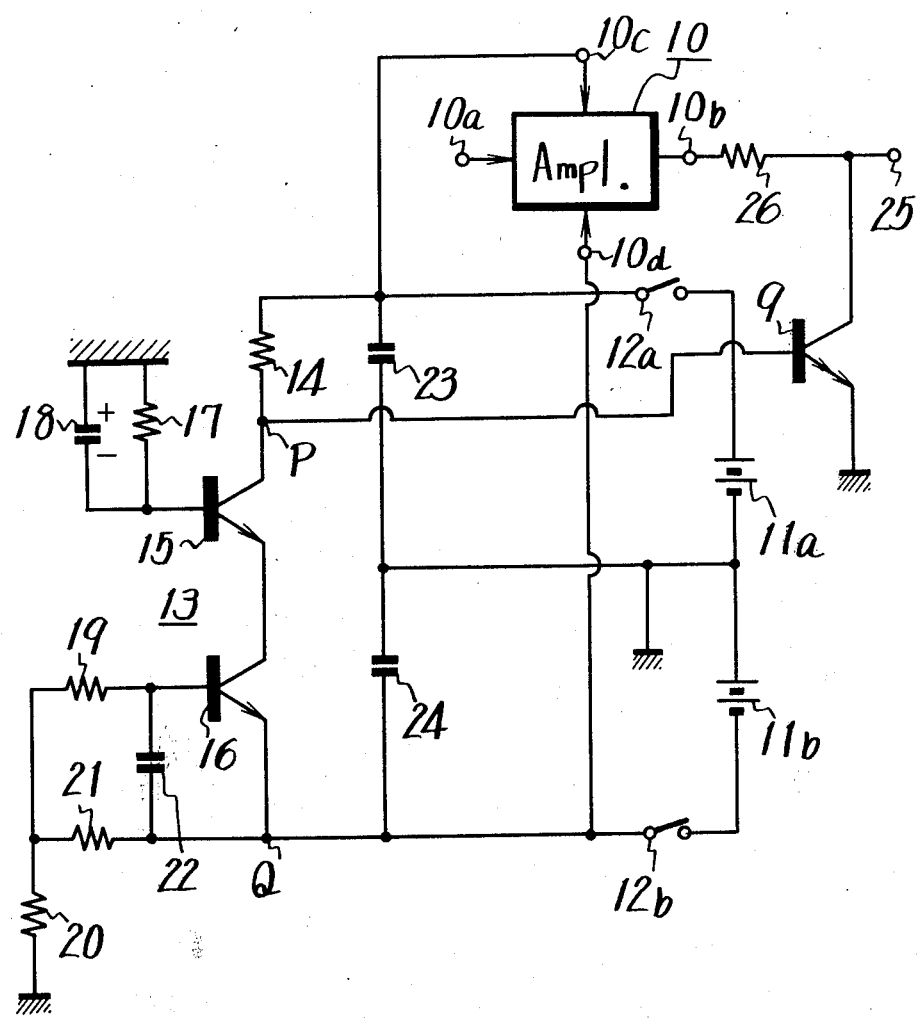
FIG. 1 is a schematic circuit diagram showing one embodiment of this invention.

FIG. 1 shows one embodiment in which an output signal of an amplifier is muted for a predetermined time after the ON-OFF manipulation of its voltage source switches. In FIG. 1, an amplifier 10 is shown having an input terminal 10a and an output terminal 10b. Positive and negative voltage source terminals 10c and 10d of the amplifier 10 are shown. The amplifier used in this embodiment is of two voltage sources single-ended push-push (SEPP) type, by way of example. The output terminal 10b is connected through a resistor 26 to an output terminal 25 and the connection point between the resistor 26 and the output terminal 25 is grounded through the collector-emitter path of a transistor 9. Positive and negative voltage sources 11a and 11b supply the terminals 10c and 10d with operating voltages through voltage source switches 12a and 12b. Between the voltage source switches 12a and 12b, there is provided a control signal generating circuit 13 which supplies the base electrode of the transistor 9 with a control signal in response to the ON-OFF operation of the voltage source switches. That is, the control signal generating circuit 13 makes the transistor 9 conductive for a predetermined time after the ON-OFF operation of the voltage source switches to prevent the output of the amplifier 10 from being reproduced through the output terminal 25.

To this end, a series circuit consisting of a resistor 14, a point P, the collector-emitter path of a transistor 15, the collector-emitter path of a transistor 16, and a point Q is provided between the voltage source switches 12a and 12b, and also the transistors 15 and 16 are respectively connected with time constant circuits. That is, a parallel circuit of a resistor 17 and a capacitor 18 is connected between the base electrode of the transistor 15 and the ground, and a capacitor 22 is connected between the base electrode of the transistor 16 and the point Q. A series circuit of resistors 19 and 21 is connected across the capacitor 22, and the connection point between the resistors 19 and 21 is grounded through a resistor 20. In addition, between the voltage source switches 12a and 12b there is connected a series circuit of capacitors 23 and 24 for bypassing ripple components, and the connection point between the capacitors 23 and 24 is connected to the connection point between the voltage sources 11a and 11b and also connected to the ground.

With the above described construction, when the switches 12a and 12b are turned on, a current flows from one end of the voltage source 11b through the path of a grounded-resistor 20, resistor 21, point Q and switch 12b to the other end of the voltage source 11b, but no current is supplied to the base electrode of the transistor 16 for a time predetermined by the resistor 19 and the capacitor 22 to make it in an OFF-state. Therefore, the transistor 15 is also in an OFF-state and hence the base electrode of the transistor 9 is connected to one end of the voltage source 11a through the resistor 14. Accordingly, the base electrode of the transistor 9 is biased with a voltage close to that of the voltage source 11a to turn it on. As a result, pop noise caused by the amplifier 10 upon turning-on the voltage source is not reproduced at the output terminal 25.

Thus, the capacitor 22 is charged. When a voltage across the capacitor 22 becomes larger than the base-emitter forward junction $V_{BE}$ of the transistor 16, the same is turned on. Then current flows through the base-emitter path of the transistor 15 to turn it on. Accordingly, the emitter electrode of the transistor 16 or the point Q and the point P are substantially short-circuited and hence the base electrode of the transistor 9 is connected to the negative voltage source 11b to make the transistor 9 nonconductive. Consequently, an output signal is reproduced at the output terminal 25 without the associated unpleasant pop noise otherwise generated by turning on the receiver. At an instance when these switches 12a and 12b are turned off, the electric charge stored in the capacitor 22 keeps the conductive state of the transistor 16. On the other hand, the transistor 15 is reverse biased by the electric charge of the capacitor 18 to turn if off immediately, so that the path between the points P and Q is cut off. Accordingly, the electric charge of the capacitor 23 is supplied to the base electrode of the transistor 9 to turn it on with the result that the output terminal 10b of the amplifier 10 is short-circuited. Consequently, the pop noise generated in the amplifier 10 upon turning-off the voltage source switches is prevented from being reproduced at the output terminal 25. In the illustrated embodiment, the resistor 26 is connected between the output terminal 10b of the amplifier 10 and the output terminal 25 to be connected with a load (not shown), and the ratio between the resistance value of the resistor 26 and the impedance component of the transistor 9 in an ON-state is properly selected to suppress the output obtained at the output terminal 25.

In this case, the discharging time constant of the time constant circuit consisting of the capacitor 18 and the resistor 17 is selected to be larger than that of the time constant circuit consisting of the capacitor 22 and the resistors 19 and 21. With such an arrangement, after the switches 12a and 12b are turned, off, the transistor 15 is prevented from being turned on again during the period where the transistor 16 is in the ON-state.

Therefore, according to the present invention, since the output of the amplifier 10 is suppressed or cut off upon the ON-OFF operation of the voltage source switches 12a and 12b, the pop noise generated upon the ON-OFF operation can be removed. If the resistor 26 and the transistor 9 are located at the input side, terminal 10a, of the amplifier 10, the same result can be achieved.

Further, when the transistor 9 is nonconductive the voltage of the negative voltage source 11b is directly supplied to the base electrode of the transistor 9 through the voltage source switch 12b and the path between the points P and Q. The above supply is carried out in order to bias the base voltage of the resistor 9 at its nonconductive time to a value larger than the level of the reproduced output at the output terminal 25 so that the output signal thereof may not leak through the collector-base junction of the transistor 9. Thus, the distortion of a signal waveform at its negative portion can be removed and also the transistor 9 is required to have a large $BV_{BEO}$ (collector-opened-base-emitter voltage) at ist nonconductive time. As a transistor having such a large $BV_{BEO}$, a newly developed semiconductor element is suitable. A newly developed semiconductor element used in this invention will hereinbelow be described with reference to FIGS. 2 and 3.

The emitter-grounded current amplification factor $h_{FE}$ used as one of parameter for evaluating the characteristics of a transistor is given by the following equation with the base-grounded current amplification factor being taken as $\alpha$.

$$h_{FE} = \frac{\alpha}{1 - \alpha} \tag{1}$$

The base-grounded current amplification factor $\alpha$ is given as follows:

$$\alpha = \alpha^* \beta \gamma \tag{2}$$

where $\alpha^*$ is the collector amplification factor, $\beta$ is the base transport efficiency and $\gamma$ is the emitter injection efficiency. The emitter injection efficiency $\gamma$ of an NPN-type transistor will now be considered. In this case, $\gamma$ is given by the following equation.

$$\gamma = \frac{J_n}{J_n + J_p} = \frac{1}{1 + \frac{J_p}{J_n}} \tag{3}$$

where $J_n$ is the current density according to electrons injected into the base from the emitter, and $J_p$ is the current density according to holes injected into the emitter from the base.

Now, $J_n$ and $J_p$ are respectively expressed as follows:

$$J_n = \frac{qD_n n_u}{L_n} \left\{ \exp \frac{(qV)}{kT} \right\} - 1 \tag{4}$$

$$J_p = \frac{qD_p p_u}{L_p} \left\{ \exp \frac{(qV)}{kT} - 1 \right\} \tag{5}$$

Therefore, the following equation is obtained.

$$\delta = \frac{J_p}{J_n} - \frac{L_n}{L_p} \cdot \frac{D_p}{D_n} \cdot \frac{p_u}{n_u} \tag{6}$$

where
- $k$: Boltzmann's constant
- $T$: absolute temperature
- $L_n$: diffusion length of minority carrier in base
- $L_p$: diffusion length of minority carrier in emitter
- $D_n$: diffusion constant of minority carrier in base
- $D_p$: diffusion constant of minority carrier in emitter
- $n_p$: concentration of minority carrier in base at its equilibrium
- $p_n$: concentration of minority carrier in emitter at its equilibrium
- $V$: voltage applied to emitter junction If the emitter impurity concentration is taken as $N_D$ and the base impurity concentration as $N_A$, $p_n/n_p$ can be replaced by $N_A/N_D$, and $L_n$ is limited by the base width $W$ to be expressed as $L_n = W$. As a result, the following equation is obtained.

$$\delta = \frac{W}{L_p} \cdot \frac{D_p}{D_n} \cdot \frac{N_A}{N_D} \qquad (7)$$

The diffusion constant is a function of carrier mobility and temperature and regarded as substantially constant.

As will be obvious from the abovementioned equations, in a normal transistor the value of $\delta$ is preferred to be small in order to enhance its $h_{FE}$.

For this reason, in the normal transistor the emitter impurity concentration $N_D$ is made sufficiently large in order to make the value of $\delta$ small.

However, if the emitter impurity concentration is made sufficiently large, for example, larger than $10^{19}$ atoms/cm³, the lifetime $\tau_p$ of minority carrier injected into the emitter from the base is shortened due to nonperfectness of crystal caused by the occurrence of lattice defect, dislocation and the like and high emitter impurity concentration itself. Therefore, the diffusion length $L_p$ of the minority carriers (holes) becomes short by the following equation.

$$L_p = \sqrt{D_p \tau_p} \qquad (8)$$

Accordingly, as apparent from the equation (7), the value of $\delta$ cannot be made so small and the injection factor $\gamma$ is also not enhanced more than a certain extent.

Figure 2:
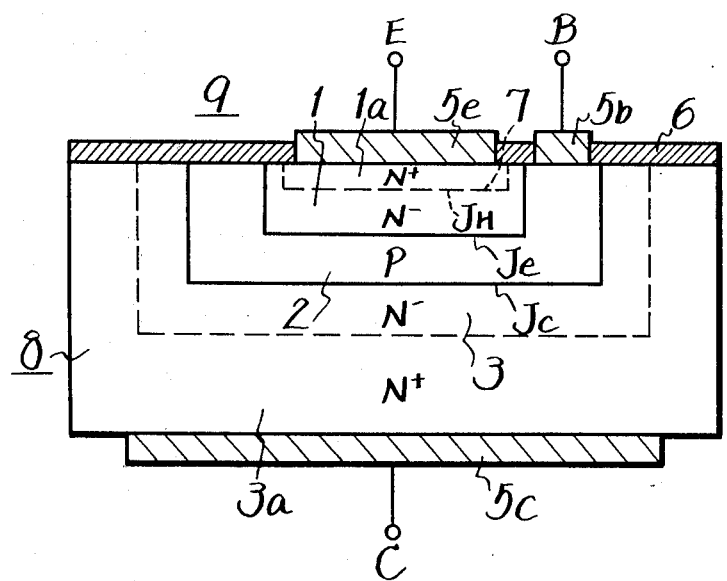
FIG. 2 is a cross-sectional view showing one example of a switching transistor used in a muting circuit of this invention.

One embodiment of a semiconductor device free from the above defects will now be described with reference to FIG. 2. In the illustrated embodiment, an NPN-type transistor is constructed. In this case, a semiconductor substrate 8 is provided therein with a first semiconductor region or emitter region 1 of a first conductivity type of N-type, in this example, having high resistivity, a second semiconductor region or base region 2 of a second conductivity type of P-type having high resistivity which is disposed adjacent to the first region 1, and a third semiconductor region or collector region 3 of the first conductivity type of N-type similarly having high resistivity which is disposed adjacent to the second region 2. A first PN-junction or emitter junction $J_e$ is formed between the first and second regions 1 and 2, and a second PN-junction or collector junction $J_c$ is formed between the second and third regions 2 and 3. At a position in the first region 1 opposing to the junction $J_e$ with a distance therebetween smaller than the diffusion length $L_p$ of minority carriers (holes) injected from the second region 2 into the first region 1, there is provided a potential barrier 7 which is higher than the energy of the minority carriers, at least higher than heat energy. In the embodiment of FIG. 2, the first region 1 is provided therein with a high impurity concentration region 1a of the same conductivity type as the former's and an L-H junction $J_H$ is formed in the region 1.

Then, on the high concentration region 1a in the first region, the second region 2 and the third region 3, there are deposited first, second and third electrodes, that is, emitter, base and collector electrodes 5e, 5b, and 5c, respectively, in ohmic contact therewith, and first, second and third terminals, that is, emitter, base and collector terminals E, B, and C are respectively led out therefrom.

A portion of the first region 1 except the high concentration region 1a is selected to have the quite low impurity concentration such as in order of $10^{15}$ atoms/cm³, and the second region 2 is selected to have the impurity concentration in an order of $10^{15}$ to $10^{18}$ atoms/cm³. Further, the third region 3 is also selected to have substantialy the same impurity concentration as that of the first region 1 such as in an order of $10^{15}$ atoms/cm³.

Since portions of the respective regions 1, 2, and 3 at least forming the junctions $J_e$ and $J_c$ are low in impurity concentration and superior in crystalline property, the diffusion length $L_p$ of minority carriers in the first region 1 becomes large.

Reference numeral 3a represents a low resistive region of high impurity concentration provided in the third region 3 spaced from the junction $J_c$, and reference numeral 6 denotes an insulating layer such as SiO₂ formed on the surface of the substrate 8.

With the above described construction, the terminals E, B, and C are respectively applied with voltages so that the emitter junction $J_e$ is forwardly biased and the collector junction $J_c$ is backwardly biased. Thus, the transistor operation is achieved. In this case, the hole injected into the first region or emitter region 1 from the second region or base region 2 has long lifetime due to low impurity concentration of the first region 1, superior crystalline property and the like, and hence the diffusion length $L_p$ of the hole in the first region 1 is long. Accordingly, as apparent from the equations (6) and (3) the emitter injection efficiency $\gamma$ can be made large. However, even though the diffusion length $L_p$ is made long, if thus injected holes practically reach the substrate surface for being subjected to surface recombination, the diffusion length $L_p$ cannot be made substantialy long. With the above construction, however, since the potential barrier 7 is disposed opposing to the emitter junction $J_e$ with a distance therebetween smaller than the diffusion length $L_p$, the surface recombination becomes small and hence the diffusion length $L_p$ can be regarded as sufficiently long.

Since the potential barrier 7 is thus provided, the current component $J_p$ of holes injected into the first region 1 from the second region 2 is effectively made small. That is, at the L-H junction $J_H$ in the first region 1 there occurs the difference of several Fermi levels, that is, the built-in-field which acts against the diffusion of holes as the minority carrier. Therefore, when the level is quite high, the diffusion current caused by the concentration gradient of holes and the drift current caused by the built-in-field are cancelled out at the L-H junction $J_H$ to reduce the hole current $J_p$ injected from the base through the low concentration emitter. Owing to the above effect, the ration of electron current reaching the collector among the current component passing through the emitter junction is raised, with the result that the value of the emitter injection efficiency $\gamma$ becomes large and $h_{FE}$ becomes high as obvious from the equation (3).

It is required that the level difference (the height of the potential barrier) is selected to be larger than hole energy, at least larger than heat energy. The heat energy is approximated to substantially $kT$, and the above mentioned level difference is desired to be larger than 0.1 eV. In the transition region of this potential, the diffusion length of holes should not be terminated within the region. In other words, the diffusion length $L_p$ of holes is required to be larger than the width of this transition region. In the case of the L-H junction as shown in FIG. 2, the potential barrier of 0.2 eV can be provided by properly establishing the amount of impurities and gradient of the high impurity concentration region 1a.

Figure 3:
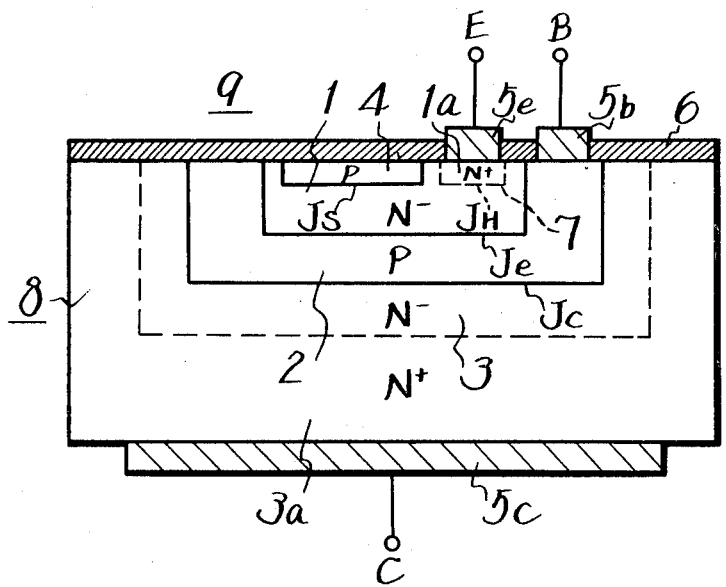
FIG. 3 is a cross-sectional view showing another example of the switching transistor used in the muting circuit of this invention.

FIG. 3 shows another embodiment of this invention, in which elements corresponding to those in FIG. 2 are indicated by the same references with their detailed description being omitted. In FIG. 3, the high impurity concentration region 1a is provided in the first region 1 to form the potential barrier 7 as mentioned above, and also an additional region 4 of P-type is provided in the first region 1 in opposition to the first junction $J_3$ to form a PN-junction $J_s$ therebetween. In this case, the distance between the PN-junction $J_s$ of the region 4 and the junction $J_e$ is similarly selected shorter than the diffusion length $L_p$ of minority carriers in the first region 1. That is, in this case, the holes injected into the first region 1 are effectively reached to the additional region 4 because the diffusion length is long as mentioned above and then absorbed into the P-type additional region 4. When the additional region 4 is electrically isolated, its potential is being risen according to the increase of holes to forwardly bias the PN-junction $J_s$ formed between the additional region 4 and the first region 1 up to substantially its rising-up voltage and the holes are re-injected into the first region 1. For this reason, the concentration of holes near the additional region 4 of the first region 1 is increased. As a result, the concentration distribution of holes between the junctions $J_e$ and $J_s$ of the first region 1 is uniformed to make its gradient gentle and the diffusion current $J_p$ from the second region 2 to the first region 1 is decreased.

In the embodiment shown in FIG. 3, the additional region 4 of the same conductivity type as that of the second region 2 is provided separately from the second region 2. It will also be noticed that the additional region 4 can be constructed in such a manner as extending from the region 2 in succession.

In the above described embodiments, the first, second and third regions 1, 2 and 3 are operated respectively as emitter, base and collector. However, in the aforesaid semiconductor elements, the first and third regions 1 and 3 are selected to have low impurity concentration of the same extent to each other with the second region 2 being interposed therebetween and hence these semiconductor elements have the symmetrical construction looking from the region 2. Accordingly, even if they are used as a backward transistor such that the first, second and third regions 1, 2 and 3 are operated respectively as collector, base and emitter, superior transistor operation can be achieved. In other words, the transistor of this invention has characteristics electrically superior in symmetry relative to a forward-backward bidirectional transistor.

In this case, in order to obtain much superior $h_{FE}$ characteristics with respect to the backward transistor, the low resistive region 3a of the third region 3 is provided extending to the peripheral side surface of the substrate 8 so as to avoid the surface recombination at the peripheral side surface of the substrate 8. Further, the distance between the low resistive region 3a and the second region 2 is selected at each portion to be smaller than the diffusion length of minority carriers injected into the third region 3 and a potential barrier with its height higher than the energy of the minority carriers is provided between the regions 3 and 3a.

The above described semiconductor element has the following advantages.

1. The current amplification factor $h_{FE}$ is high and can be made more than 3000.

2. The factor $h_{FE}$ is less uneven. That is, hitherto in normal transistor, for increasing the emitter injection efficiency the concentration of the emitter region is fully enhanced. In short, the emitter injection efficiency is enhanced depending on the difference between the concentrations at portions in the emitter and base regions near the junction therebetween. Therefore, the establishment of the concentrations and the like of both regions must be relatively selected. On the contrary, in the above described semiconductor element, the current component of minority carriers injected into the first region is suppressed to increase the emitter injection efficiency by forming the potential barrier in the first region 1 opposing to the first junction $J_e$, so that the first and second regions 1 and 2 are less affected to each other in cooperation with the fact that the first region 1 can be selected relatively low in concentration, and the width of the region 2, the concentration distribution and the like can be made without scattering according to its design. Accordingly, the scatterng of $h_{FE}$ can be made less.

3. Since the influence of the surface recombination is arranged to be avoided, $h_{FE}$ is high even in a case of small current.

4. Noise becomes small. In other words, since the main portions of the first and second junctions $J_e$ and $J_c$ are respectively formed in P-type and N-type regions with low impurity concentration, the cyrstal defect is small. Further, for example, the impurity concentration of the second region 2 near the second electrode 5b is made high, so that the lateral current component of the emitter-base current as a transistor along the substrate surface can be decreased. Thus, flicker noise or $1/f$ noise can be reduced. The burst noise and $1/f$ noise can be also decreased due to high $h_{FE}$. In addition, if the base spreading resistance $r_{bb}$, is made small, the noise is decreased even with low signal source impedance.

5. The temperature characteristics of $h_{FE}$ is good.

6. The characteristics relating to the positive and negative bidirectional transistor are symmetric.

7. Since the impurity concentrations near the first and second junctions $J_e$ and $J_c$ are low, the collector-opened base-emitter withstanding voltage $BV_{BEO}$ is high with respect to the positive and negative bidirectional transistor.

8. In the case of being used in a power transistor, the emission is uniformed due to the distributed resistance in in the emitter, so that the strength is high.

9. The saturation characteristics are good.

10 If the region 4 for effecting injecton of re-injection is provided, the equivalent resistance of the base is decreased.

The above described embodiments perform the transistor operation of NPN-type. However, it is also possible to effect the transistor operation of PNP-type with the conductivity type of each region illustrated in FIGS. 2 and 3 being reversed.

As will be apparent from the above description, the aforesaid semiconductor element has may superior features. With the muting circuit of this invention, the semiconductor element can be reversely biased so as to make its base-emitter voltage sufficiently larger than the amplitude of the output signal. Therefore, the output signal of the muting circuit will not be distorted when the semiconductor element thereof is in nonconductive state.

It will be apparent that the present invention is not limited to the above described embodiments, and many modifications and variations may be effected without departing from the scope of the novel concepts of this invention.

I claim as my invention:

1. A muting circuit comprising:
   an amplifier having an input and an output terminal,
   a circuit point of low reference potential,
   a bidirectional transistor connected in said circuit to a couple a signal from said output terminal to said point of low reference potential,
   a supply source coupled in said circuit for said amplifier when coupled thereto,
   switch means for coupling and uncoupling said supply source to and from said amplifier,
   a control signal generating means coupled to an input of said bidirectional transistor,
   said control signal generating means including circuit means responsive to the operation of said switch means for turning on said bidirectional transistor for a predetermined interval to provide a low impedance circuit path for said output of said amplifier, whereby turning on and off of said amplifier is accompanied by a bypassing of a short time signal from said amplifier through said bidirectional transistor.

2. A muting circuit in accordance with claim 1 wherein said bidirectional transistor is an NPN-type having first, second and third electrodes, the first electrode being the emitter and being connected to said circuit point of low reference potential, said second electrode being the base, said base being said input of said bidirectional transistor, said third electrode being the collector and being coupled to said output terminal of said amplifier.

3. A muting circuit in accordance with claim 2 wherein said supply source comprises a pair of positive and negative sources and wherein said switch means comprises a pair of first and second switches for coupling said positive and negative sources respectively to said amplifier.

4. A muting circuit in accordance with claim 3 wherein said control signal generating means comprises:
   a resistor, second and third transistors having respective collector and emitter electrodes connected between one terminal of said first switch and one terminal of said second switch through said resistor, the connection point between said resistor and the collector electrode of said second transistor being connected to the base electrode of said bidirectional transistor; a first time constant circuit coupled between the base electrode of said second transistor and said reference potential; a second time constant circuit coupled between the base electrode of said third transistor and said reference potential; said first and second time constant circuits being operative to control the conduction of said second and third transistors so as to make said bidirectonal transistor conductive for a predetermined time interval after said first and second switches are manipulated.

5. A muting circuit in accordance with claim 4 wherein said first time constant circuit comprises a second resistor and a first capacitor connected in parallel between the base electrode of said second transistor and said reference potential, said second time constant circuit comprises a second capacitor connected between the base and emitter electrodes of said third transistor, third and fourth resistors connected in series across said second capacitor, and a fifth resistor connected between the connection point of said third and fourth resistors and said reference potential.

6. A muting circuit comprising:
   an amplifier having an input and an output terminal,
   a circuit point of low reference potential,
   a bidirectional transistor connected in said circuit to couple a signal from said output terminal to said point of low reference potential,
   said bidirectional transistor having a first semiconductor region of one conductivity type,
   a second semiconductor region of the opposite conductivity type adjacent said first region with a first semiconductor junction therebetween,
   a third semiconductor region of the same type as said first region adjacent said second region with a second semiconductor junction therebetween,
   said first region being associated with a potential barrier having energy higher than that of minority carriers injected from the second region to the first region,
   said barrier being provided at a position facing said first junction and spaced from the same by a distance smaller than the diffusion distance of the minority carriers, and first, second and third terminals coupled to said first, second and third regions, respectively,
   a supply source coupled in said circuit for said amplifier when coupled thereto,
   switch means for coupling and uncoupling said supply source to and from said amplifier,
   a control signal generating means coupled to an input of said bidirectional transistor,
   said control signal generating means including circuit means responsive to the operation of said switch means for turning on said bidirectional transistor for a predetermined interval to provide a low impedance circuit path for said output of said amplifier, whereby turning on and off of said amplifier is accompanied by a bypassing of a short time signal from said amplifier through said bidirectional transistor.

7. A muting circuit in accordance with claim 6 wherein said first semiconductor region of said first transistor further includes an additional semiconductor region consistng of the same material as that of said second semiconductor region, one side of said additional region being disposed opposite to the junction of said first and second semiconductor regions at a distance smaller than the diffusion length of minority carrier of said second semiconductor region.

* * * * *